United States Patent
Ji

(10) Patent No.: US 12,089,481 B2
(45) Date of Patent: Sep. 10, 2024

(54) METHOD FOR MANUFACTURING A DISPLAY PANEL

(71) Applicant: KunShan Go-Visionox Opto-Electronics Co., Ltd., Suzhou (CN)

(72) Inventor: Pengfei Ji, Suzhou (CN)

(73) Assignee: KUNSHAN GO-VISIONOX OPTO-ELECTRONICS CO., LTD., Kunshan (CN)

(*) Notice: Subject to any disclaimer, the term of this patent is extended or adjusted under 35 U.S.C. 154(b) by 554 days.

(21) Appl. No.: 17/314,301

(22) Filed: May 7, 2021

(65) Prior Publication Data

US 2021/0265604 A1 Aug. 26, 2021

Related U.S. Application Data

(63) Continuation of application No. PCT/CN2019/108558, filed on Sep. 27, 2019.

(30) Foreign Application Priority Data

Mar. 1, 2019 (CN) .......................... 201910155804.1

(51) Int. Cl.
*H10K 71/00* (2023.01)
*H10K 50/844* (2023.01)
(Continued)

(52) U.S. Cl.
CPC ............ *H10K 71/00* (2023.02); *H10K 50/844* (2023.02); *H10K 59/12* (2023.02); *H10K 59/40* (2023.02); *H10K 71/851* (2023.02)

(58) Field of Classification Search
CPC ..... H10K 71/00; H10K 71/851; H10K 50/844
See application file for complete search history.

(56) References Cited

U.S. PATENT DOCUMENTS

2003/0218422 A1 11/2003 Park et al.
2010/0196679 A1* 8/2010 Morishima ............ H10K 50/84
428/68

(Continued)

FOREIGN PATENT DOCUMENTS

CN 102610762 A 7/2012
CN 103700662 A 4/2014
(Continued)

OTHER PUBLICATIONS

Chinese First Office Action issued on Oct. 28, 2019 in corresponding Chinese Application No. 201910155804.1; 13 pages.
(Continued)

*Primary Examiner* — Reema Patel
(74) *Attorney, Agent, or Firm* — Maier & Maier, PLLC

(57) ABSTRACT

A method for manufacturing a display panel includes: providing a substrate motherboard, the substrate motherboard having multiple display panel regions and multiple cutting regions for dividing the plurality of display panel regions, each of the multiple display panel regions including a display region and a non-display region; providing multiple emitting devices in the display region; packaging the multiple light emitting devices to form a film package layer, the film package layer including at least one inorganic package layer; forming an insulation layer on a side of the inorganic package layer away from the substrate motherboard; patterning the insulation layer, and at the same time, performing an etching process to remove material of the inorganic package layer located in the plurality of cutting regions; and cutting the substrate motherboard to separate the multiple display panel regions and form multiple display panels.

17 Claims, 4 Drawing Sheets

(51) Int. Cl.
*H10K 59/12* (2023.01)
*H10K 59/40* (2023.01)

(56) References Cited

U.S. PATENT DOCUMENTS

| | | | |
|---|---|---|---|
| 2016/0343988 | A1 | 11/2016 | Meyer et al. |
| 2017/0084883 | A1 | 3/2017 | Kwon et al. |
| 2018/0151831 | A1* | 5/2018 | Lee .................. H10K 50/844 |
| 2018/0294436 | A1 | 10/2018 | Choi et al. |

FOREIGN PATENT DOCUMENTS

| CN | 103811682 A | 5/2014 |
|---|---|---|
| CN | 104904313 A | 9/2015 |
| CN | 105609655 A | 5/2016 |
| CN | 105957976 A | 9/2016 |
| CN | 205609526 U | 9/2016 |
| CN | 106711174 A | 5/2017 |
| CN | 106711184 A | 5/2017 |
| CN | 107492566 A | 12/2017 |
| CN | 107845737 A | 3/2018 |
| CN | 108022878 A | 5/2018 |
| CN | 108400150 A | 8/2018 |
| CN | 108598287 A | 9/2018 |
| CN | 108666352 A | 10/2018 |
| CN | 208271900 U | 12/2018 |
| CN | 208271946 U | 12/2018 |
| CN | 109962180 A | 7/2019 |

OTHER PUBLICATIONS

Chinese Second Office Action issued on May 6, 2020 in corresponding Chinese Application No. 201910155804.1; 13 pages.
Notification to Grant Patent Right for Invention issued on Sep. 3, 2020 in corresponding Application No. 201910155804.1; 6 pages.
International Search Report issued on Dec. 31, 2019 in corresponding International application No. PCT/CN2019/108558; 11 pages.

* cited by examiner

METHOD FOR MANUFACTURING A DISPLAY PANEL

CROSS-REFERENCE TO RELATED APPLICATIONS

The present application is a continuation-application of International (PCT) Patent Application No. PCT/CN2019/108558, filed on Sep. 27, 2019, which claims foreign priority of Chinese Patent Application No. 201910155804.1, filed on Mar. 1, 2019, in the China National Intellectual Property Administration, the contents of all of which are hereby incorporated by reference.

TECHNICAL FIELD

The present disclosure generally relates to display technology, and particularly to a method for manufacturing a display panel.

BACKGROUND

Organic light emitting diode (OLED) displays are one of the hottest areas in the flat display filed. Compared with liquid crystal displays, OLED displays have several advantages such as low consumption, low cost, self-luminous ability, wide viewing angles and high response speed. OLED displays are already widely used in different flat display areas such as mobile phones, personal digital assistances (PDA) and digital cameras. A traditional OLED display panel usually includes a substrate, a display component layer and a film package layer. The film package layer usually includes an inorganic package layer and an organic package layer. The inorganic package layer is configured to block water and oxygen, and the organic package layer is configured to improve the flexibility of the film package layer.

SUMMARY

Accordingly, the present disclosure aims to provide a method for manufacturing a display panel which can improve the packaging performance and service life of the display panel.

According to a first aspect of the present application, a method for manufacturing a display panel is provided. The method includes: providing a substrate motherboard, wherein multiple display panel regions and cutting regions for dividing the display panel regions are defined in the substrate motherboard, wherein a display region and a non-display region are defined in each display panel region and multiple light emitting devices are provided in the display region: packaging the light emitting devices to form a package layer, wherein the package layer includes at least one inorganic package layer: forming an insulation layer on the package layer: patterning the insulation layer and removing the inorganic package layer material located in the cutting regions by etching at the same time; and cutting the substrate motherboard to separate the display panel regions and form multiple display panels.

According to the present disclosure, material of the inorganic package layer sputtering in the cutting regions can be removed while the insulation layer is patterned, which can prevent the package layer from being damaged in subsequent processes. The implementation of the present disclosure may improve the packaging performance and service life of display components.

DETAILED DESCRIPTION

In order to explain more clearly and accurately the purposes, schemes and effects of the present disclosure, the disclosure will now be described in detail with reference to the accompanying drawings and examples.

In a process of manufacturing a display panel, a large substrate motherboard is used for manufacturing multiple display panel structures, and the multiple display panel structures are cut into small-sized display panels. In the process of manufacturing, light emitting devices need to be packaged, for example, by a film package. A film package layer includes at least one inorganic package layer for blocking water and oxygen. The inorganic package layer is usually formed by deposition with a mask. However, during the deposition, some material of the inorganic package layer may be sputtered out of the packaging region. Particularly, while manufacturing a thin bezel display, a space out of the packaging region is relatively limited, and the material of the inorganic package layer may be sputtered into a cutting region. When the substrate motherboard is cut, a part of inorganic package layer material in the cutting region may be cut. Since the part of inorganic package layer material in the cutting region is connected to the inorganic package layer in the packaging regions, and the cutting may damage the inorganic package layer and create cracks, the package may deteriorate, and the component may fail if the cracks extend to the packaging regions. The present disclosure provides a method for manufacturing a display panel. According to the present disclosure, the film package layer of the manufactured display panel includes at least one insulation layer, and the material of the inorganic package layer sputtering in the cutting regions can be etched and removed during the manufacture of the insulation layer, which can prevent the inorganic package layer in the packaging regions from being damaged in subsequent cutting operations. Thus, the implementation of the present disclosure may improve the packaging performance and service life of the display panel.

Figure 1:
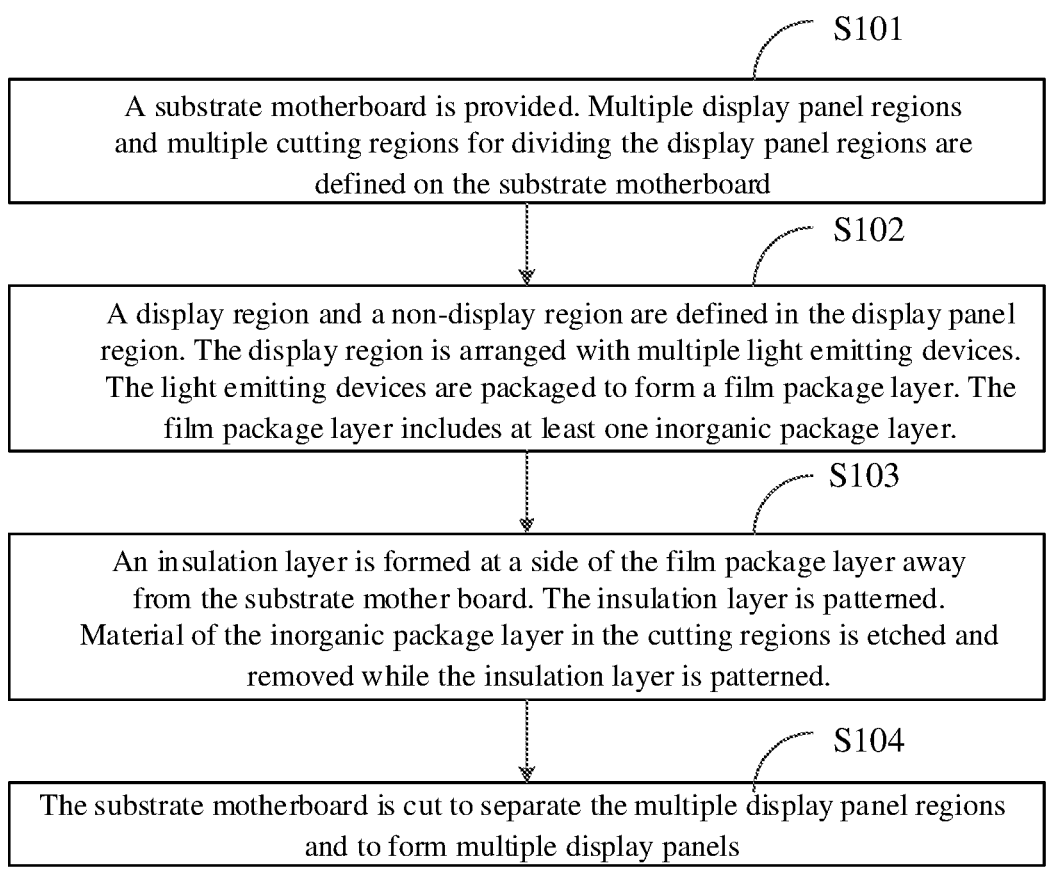
FIG. 1 is a flow chart of a method for manufacturing a display panel according to a first embodiment of the present disclosure.
Figure 2:
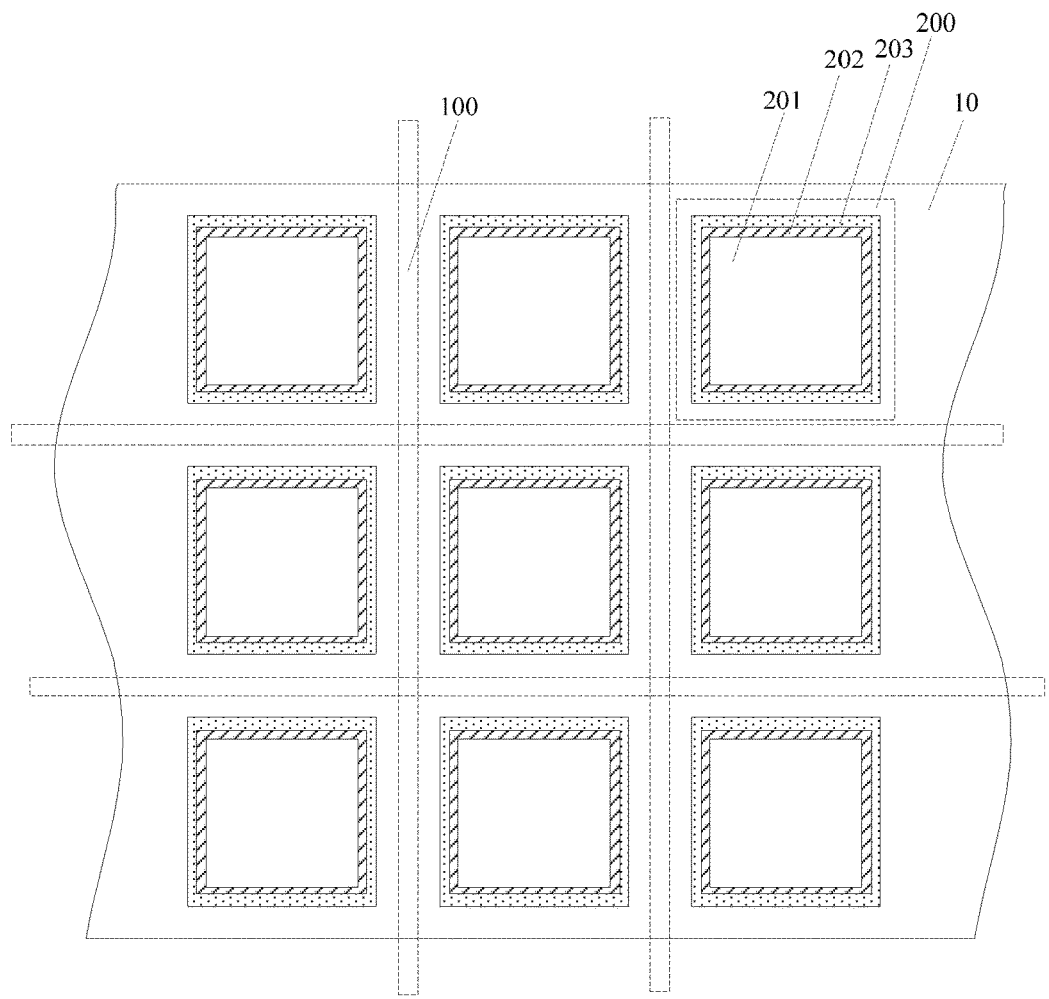
FIG. 2 is a top view of a substrate motherboard according to the first embodiment of the present disclosure.
Figure 3:
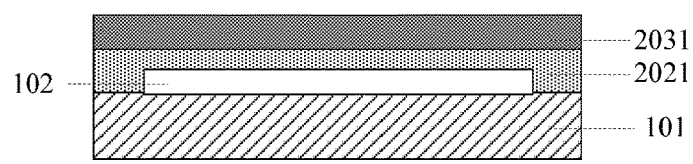
FIG. 3 is a cross-section view of a display panel region according to the first embodiment of the present disclosure.

Referring to FIGS. 1-3, FIG. 1 is a flow chart of a method for manufacturing a display panel according to a first embodiment of the present disclosure, FIG. 2 is a top view of a substrate motherboard according to the first embodiment of the present disclosure, and FIG. 3 is a cross-section view of a display panel region according to the first embodiment of the present disclosure. In the present embodiment, the method for manufacturing a display panel includes following operations.

In an operation S101, a substrate motherboard is provided. A plurality of display panel regions and a plurality of cutting regions for dividing the display panel regions are defined on the substrate motherboard.

The substrate motherboard 10 is an intact substrate without being packaged and cut. In some embodiments, the substrate motherboard 10 may be an OLED substrate. The substrate motherboard 10 may include at least an array substrate 101 and light emitting devices 102. The array substrate 101 may include a base substrate and a pixel circuit array. The light emitting devices 102 may be disposed within display regions of the display panel regions 200. Each of the light emitting devices 102 may include at least an anode layer, an organic light emitting layer and a cathode layer. The element 102 shown in FIG. 3 illustrates all the light-emitting devices within a display panel region.

The cutting regions 100 refer to areas where a cutting tool pass by while cutting the substrate motherboard 10. A cutting region 100 may be a cutting line or an area having a certain width. In some embodiments, the cutting regions 100 may be marked on the substrate motherboard 10 with clear marking lines. In other embodiments, the cutting regions 100 may not be marked on the substrate motherboard 10.

The display panel regions 200 refer to portions to be cut into small-sized display panels.

In an operation S102, a display region and a non-display region are defined in the display panel region. The display region is arranged with a plurality of light emitting devices. The light emitting devices are packaged to form a film package layer. The film package layer includes at least one inorganic package layer.

A light emitting device may include a light emitting layer. Material of the light emitting layer is usually sensitive to moisture and oxygen. In order to protect the light emitting layer material, the light emitting devices should be packaged to form a film package layer, and the film package layer should cover the entire display region. After the packaging, a plurality of separated packaging regions 202 are formed. The film package layer may include at least one inorganic package layer 2021 for blocking water and oxygen. The inorganic package layer can be formed by deposition with mask.

In an operation of S103, an insulation layer is formed at a side of the film package layer away from the substrate motherboard. The insulation layer is patterned, and at the same time material of the inorganic package layer in the cutting regions are etched and removed.

In the display panel acquired based on the present disclosure, one side of the film package layer away from the substrate motherboard 10 is arranged with at least one insulation layer 2031. The insulation layer 2031 may be a protection layer for improving protection of display components, or it may be a functional layer for function extension of the display panel.

Photolithography technology can be utilized to pattern the insulation layer 2031 to form multiple separated insulation regions 203 which respectively correspond to the multiple packaging regions 202. In this way, material of the inorganic package layer sputtering in the cutting regions may be etched and removed while the excrescent material of the insulation layer is etched. Specifically, when the excrescent material of the insulation layer is removed by etching, the etching may be controlled to reach and penetrate through the inorganic package layer so as to remove the material of the inorganic package layer sputtering in the cutting regions.

The insulation layer 2031 may be an inorganic layer made from inorganic material, or an organic layer made from organic material. In some embodiments, the insulation layer 2031 is preferably made from the same material as the inorganic package layer.

In an operation S104, the substrate motherboard is cut to separate the plurality of display panel regions and form a number of display panels.

When the different layers on the substrate motherboard 10 are manufactured, the substrate motherboard 10 may be cut along the cutting lines or the cutting regions according to a pre-defined rule to form a number of small substrates. Subsequent processes may then be performed to acquire the display panels.

In the present embodiment, material of the inorganic package layer sputtering in the cutting regions may be etched and removed while the insulation layer is patterned, which may prevent the film package layer from being damaged in subsequent processes. Thus, the implementation of the present disclosure may improve the packaging performance and service life of display components, and does not acquire additional processes.

In one embodiment, edges of the insulation layer 203 extend beyond or flush with edges of the film package layer 202, that is, the insulation layer 2031 completely covers the inorganic package layer 2021. In this embodiment, when the excrescent insulation layer material is etched and removed, the etching outside the film package layer may penetrate through the inorganic package layer so as to remove material of the inorganic package layer sputtered in the cutting regions. In this embodiment, the photomask does not need to be adjusted, and therefore, a process cost may be reduced.

In another embodiment, edges of the film package layer 202 extend beyond edges of the insulation layer 203, that is, the insulation layer 2031 cannot completely cover the inorganic package layer 2021. In this embodiment, when the excrescent insulation layer material is etched and removed, a number of photomasks with different light transmittance are required. The etching in the cutting regions are controlled to penetrate through the inorganic package layer to prevent the film package layer in the packaging region from being damaged.

In one embodiment, the number of the insulation layer(s) can be one, two or more. If there are multiple insulation layers, the material of the inorganic package layer sputtering in the cutting regions can be removed during the patterning process of any one of the multiple insulation layers.

In one embodiment, the side of the film package layer away from the substrate motherboard is merely arranged with a first insulation layer. In this embodiment, the material of the inorganic package layer sputtering in the cutting regions is etched and removed while the first insulation layer is patterned.

In another embodiment, the side of the film package layer away from the substrate motherboard is arranged with a first insulation layer, one side of the first insulation layer away from the film package layer is arranged with a touch-control film layer, and the touch-control film layer is arranged with a second insulation layer. In this embodiment, the material of the inorganic package layer sputtering in the cutting regions may be etched and removed while the first insulation layer is patterned. Alternatively, the etching may be controlled to only penetrate through the first insulation layer when the first insulation layer is patterned, and the material of the inorganic package layer sputtering in the cutting regions may be etched and removed while the second insulation layer is patterned.

In yet another embodiment, the side of the film package layer away from the substrate motherboard is arranged with a first insulation layer, one side of the first insulation layer away from the film package layer is arranged with a touch-control film layer, the touch-control film layer may include at least a second insulation layer, and one side of the touch-control film layer away from the first insulation layer is arranged with a third insulation layer. In this embodiment, the material of the inorganic package layer sputtering in the cutting regions may be etched and removed while the first insulation layer is patterned. Alternatively, the etching may be controlled to only penetrate through the first insulation layer when the first insulation layer is patterned, and the material of the inorganic package layer sputtering in the cutting regions may be etched and removed while the second insulation layer is patterned. Alternatively, the etching may be controlled to only penetrate through the first insulation layer when the first insulation layer is patterned, the etching may be controlled to only penetrate through the second insulation layer when the second insulation layer is patterned, and the material of the inorganic package layer sputtering in the cutting regions may be etched and removed while the third insulation layer is patterned.

The method provided by the present disclosure will be further described based on the embodiment where the insulation layer is an insulation layer in a touch-control film layer and material of the inorganic package layer sputtering in the cutting regions is etched and removed during patterning of the insulation layer of the touch-control film layer. It should be understood that the present disclosure is not limited therein.

FIGS. 4-12 show a method for manufacturing the display panel. The method includes following operations.

Figure 4:
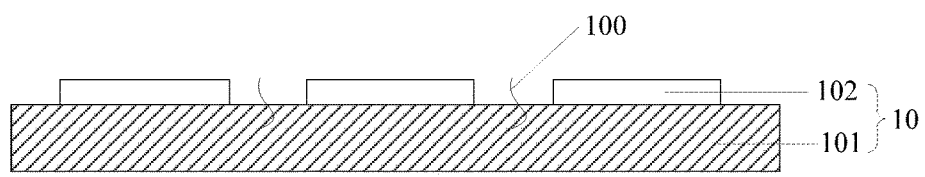
FIG. 4 is a schematic diagram of a substrate motherboard according to a second embodiment of the present disclosure, which takes an insulation layer in a touch-control film layer as the insulation layer of the display panel, and has material of an inorganic package layer in cutting regions etched and removed during patterning the insulation layer.

Referring to FIG. 4, FIG. 4 illustrates a substrate motherboard according to a second embodiment of display panel manufacturing method of the present disclosure. A substrate motherboard 10 is provided. The substrate motherboard 10 is an entire substrate without being packaged and cut. The substrate motherboard 10 may include at least an array substrate 101 and light emitting devices 102. The array substrate 101 may include a base substrate and a pixel circuit array. Each light emitting device 102 may include an anode layer, an organic light emitting layer and a cathode layer.

The base substrate may be a flexible substrate or a traditional substrate. A traditional substrate may be made from quartz, glass, metal, resin etc. For example, a resin substrate may be made from Polymethylmethacrylate (PMMA), Polyethylene terephthalate (PET), Polyethylene naphthalate (PBN) or Polycarbonate resin. A flexible substrate, for example a polyimide (PI) substrate, is usually adopted for flexible display devices. The base substrate may be made from material that is highly water-proof and has oxygen-barrier performance. Compared with bottom-emitting OLED components, the base substrate may be highly transparent, that is, light in a visible light wavelength can penetrate through the substrate.

In order to block moisture and oxygen and to protect the light emitting material, the light emitting devices should be packaged with thin films. Film package may be formed at one side of the light emitting layer away from the flexible substrate so as to protect the light emitting material. The film package layer usually includes an organic package layer and an inorganic package layer. The inorganic package layer may form barriers against moisture and oxygen effectively. The inorganic package material can be made from any one or a combination of, for example, $Al_2O_3$, $TiO_2$, $ZrO_2$, MgO, $Si_3N_4$, AlN, SiN, SiNO, SiO, $SiO_2$, SiC, $SiCN_x$ etc. Configuring the organic package layer enables the component surface to be flatter, and the inorganic package layer may be easily formed on the flat component surface in subsequent processes. Further, the organic package layer is highly bending-resistant. The organic package layer may be made from, for example, Polymethylmethacrylate (PMMA).

Figure 5:
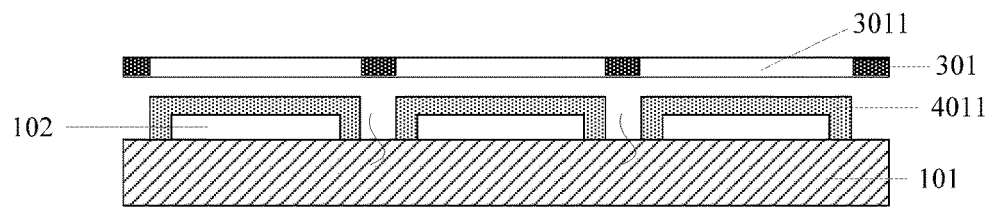
FIG. 5 is a schematic diagram of a process for forming a first inorganic package layer according to the second embodiment of the present disclosure.

Referring to FIG. 5, FIG. 5 illustrates a schematic diagram of a process for forming a first inorganic package layer according to the second embodiment of the present disclosure. Specifically, a mask 301 is provided. The mask 301 may have a plurality of openings 3011, each opening corresponding to one of the plurality of light emitting devices 102. Chemical deposition or physical vapor deposition by taking the mask 301 may be implemented to from a first inorganic package layer 4011 on the substrate motherboard 10. Due to the mask, the inorganic package layer is only formed in opening regions (display regions) during deposition of inorganic package layer material. The acquired first inorganic package layer 4011 covers completely the light emitting device 102. In other words, edges of the first inorganic package layer 4011 extend beyond edges of the display region.

Figure 6:
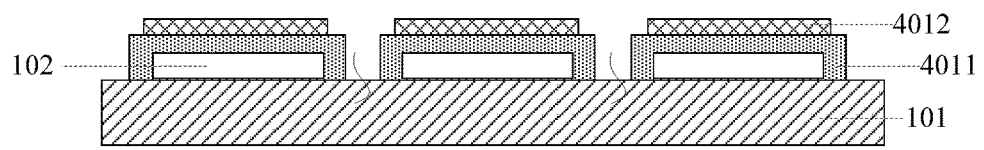
FIG. 6 is a schematic diagram of a process for forming an organic package layer according to the second embodiment of the present disclosure.

Referring to FIG. 6, FIG. 6 illustrates a schematic diagram of a process for forming an organic package layer according to the second embodiment of the present disclosure. Inkjet printing can be adopted to manufacture a first organic package layer 4012 covering the display region on the first inorganic package layer 4011. By forming the first organic package layer 4012, flatness of the component can be improved which is beneficial for forming the inorganic package layers in subsequent processes. Further, the organic package layer may improve the bending-resistance of the film package layer. The first organic package layer 4012 may cover the display region, and edges of the first organic package layer 4012 do not extend beyond edges of the first inorganic package layer 4011.

Figure 7:
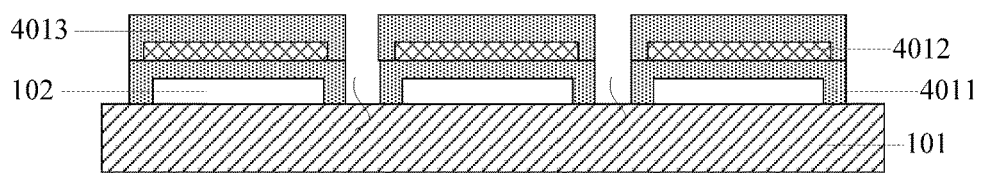
FIG. 7 is a schematic diagram of a process for forming a second inorganic package layer according to the second embodiment of the present disclosure.

Referring to FIG. 7, FIG. 7 illustrates a schematic diagram of a process for forming a second inorganic package layer according to the second embodiment of the present disclosure. Chemical deposition is further adopted to form a second inorganic package layer 4013 covering the first organic package layer on the first organic package layer 4012. The two inorganic package layers can be made from same or different materials. Edges of the second inorganic package layer 4013 may be flush with or extend beyond edges of the first inorganic package layer 4011.

After the film package layer, which includes the first inorganic package layer 4011, the first organic package layer 4012, and the second package layer 4013, is formed, the first insulation layer which can be used as a protection layer of display devices or as a touch-control liner layer is formed on the film package layer. Then the touch-control film layer can be formed on the first insulation layer. The touch-control film layer may include a first touch-control metal layer, a second insulation layer and a second touch-control metal layer.

Figure 8:
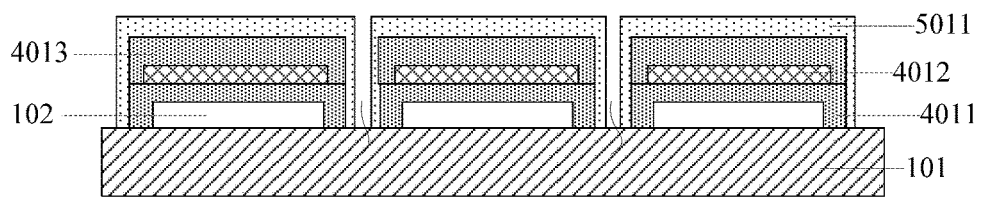
FIG. 8 is a schematic diagram of a process for forming a touch-control liner layer according to the second embodiment of the present disclosure.

Referring to FIG. 8, FIG. 8 illustrates a schematic diagram of a process for forming a touch-control liner layer according to the second embodiment of the present disclosure. A second mask is provided, and chemical deposition or physical vapor deposition may be adopted to from a first insulation layer 5011. The first insulation layer 5011 may be made from inorganic material such as silicon oxide and silicon nitride. Edges of the first insulation layer 5011 may extend beyond edges of the film package layer.

Figure 9:
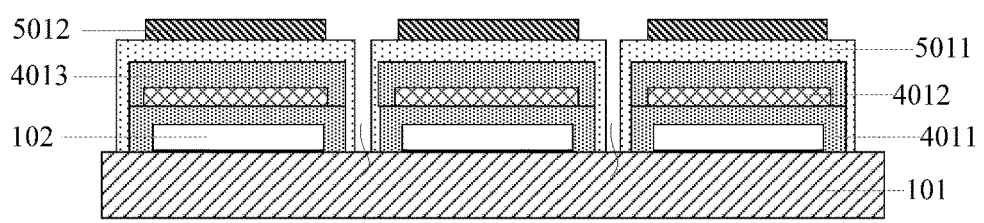
FIG. 9 is a schematic diagram of a process for forming a first touch-control metal layer according to the second embodiment of the present disclosure.

Referring to FIG. 9, FIG. 9 illustrates a schematic diagram of a process for forming a first touch-control metal layer according to the second embodiment of the present disclosure. A first touch-control metal layer 5012 may be formed on the first insulation layer 5011. The first touch-control metal layer 5012 may be made from aluminum titanium alloy, for example, TiAlTi. The first touch-control metal layer 5012 may cover the entire touch-control region, where the touch-control region refers to a region that may sense touch control. The first touch-control metal layer 5012 may be patterned to form touch-control lines and the corresponding touch-control circuit pattern.

Figure 10:
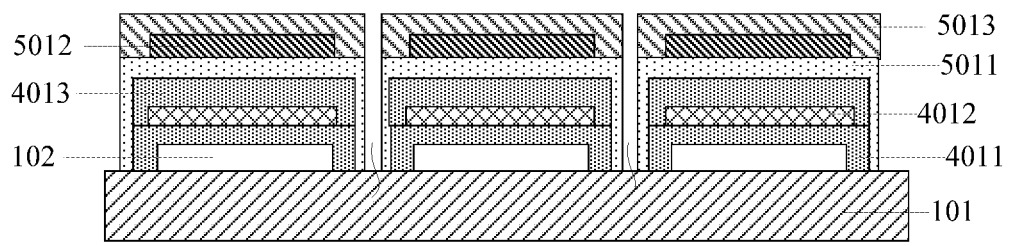
FIG. 10 is a schematic diagram of a process for forming an insulation layer according to the second embodiment of the present disclosure.

Referring to FIG. 10, FIG. 10 illustrates a schematic diagram of a process for forming an insulation layer according to the second embodiment of the present disclosure. A second insulation layer 5013 may be formed on the first touch-control metal layer 5012. Inorganic material such as silicon nitride and silicon oxide may be firstly deposited on the entire surface. Then the second insulation layer 5013 may be etched and patterned with a mask. Edges of the acquired second insulation layer 5013 may be between the edges of the film package layer and the cutting lines of the substrate. The etching in the cutting regions may be controlled to reach and penetrate through the inorganic package layer. Detailed description of the process has been explained in foregoing embodiments and will not be repeated herein. During the etching of the insulation layer, if there is excrescent film package layer material sputtering outside the packaging region (especially on the cutting lines of the substrate), material of the first insulation layer and this excrescent packaging material outside a package region can be etched and removed at the same time. Since this part of film package layer material is connected to the film package layer in the packaging regions and cutting it may create cracks, the package may deteriorate if the cracks extend to the packaging regions. In this embodiment, excrescent packaging material can be removed without additional processes, and the film package layer can be prevented from being damaged. Thus, the packaging performance and service life of the display panel may be improved.

Figure 11:
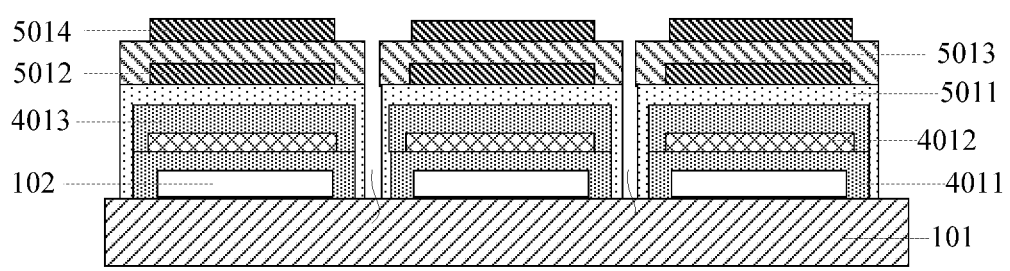
FIG. 11 is a schematic diagram of a process for forming a second touch-control metal layer according to the second embodiment of the present disclosure.

Referring to FIG. 11, FIG. 11 illustrates a schematic diagram of a process for forming a second touch-control metal layer according to the second embodiment of the present disclosure. A second touch-control metal layer 5014 may be formed on the second insulation layer 5013. The second touch-control metal layer 5014 may be made from aluminum titanium alloy, for example, TiAlTi. The second touch-control metal layer 5014 may cover the entire touch-control region. The second touch-control metal layer 5014 may be patterned to form touch-control lines and corresponding touch-control circuit pattern.

Figure 12:
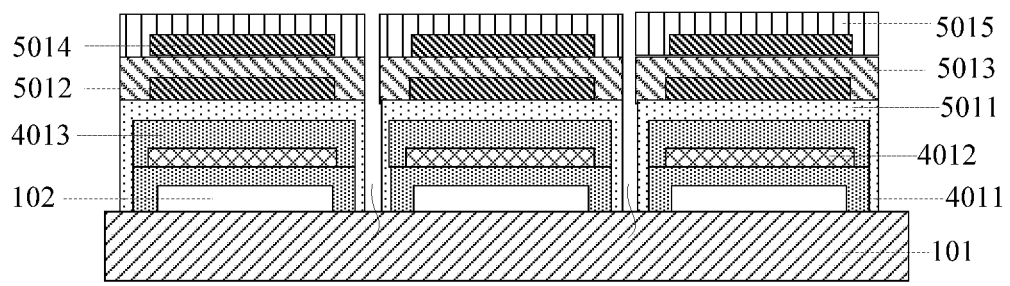
FIG. 12 is a schematic diagram of a process for forming a protection layer according to the second embodiment of the present disclosure.

Referring to FIG. 12, FIG. 12 illustrates a schematic diagram of a process for forming a protection layer according to the second embodiment of the present disclosure. A protection layer 5015 may be formed on the second touch-control metal layer 5014 to protect the touch-control film layer. The protection layer may be made from organic polymer material but is not limited herein. Edges of the touch-control protection layer 5015 may be flush with or extend slightly beyond edges of the insulation layer, but not beyond the cutting lines of the substrate.

When manufacturing of each layer is completed, the substrate motherboard 10 may be cut along substrate cutting lines and be divided into multiple small display substrates. Further processes can be performed.

As illustrated in above embodiments, the present disclosure provides a method for manufacturing a display panel. The method can remove material of the inorganic package layer in the cutting regions while the insulation layer is patterned, which can prevent the film package layer from being damaged in subsequent processes. Thus, the implementation of the present disclosure may improve packaging performance and service life of the display device.

The foregoing is merely embodiments of the present disclosure, and is not intended to limit the scope of the disclosure. Any transformation of equivalent structure or equivalent process which uses the specification and the accompanying drawings of the present disclosure, or directly or indirectly application in other related technical fields, are likewise included within the scope of the protection of the present disclosure.

What is claimed is:

1. A method for manufacturing a display panel, comprising:
   providing a substrate motherboard, the substrate motherboard having a plurality of display panel regions and a plurality of cutting regions for dividing the plurality of display panel regions, wherein each of the plurality of display panel regions comprises a display region and a non-display region;
   providing a plurality of light emitting devices in the display region;
   packaging the plurality of light emitting devices to form a film package layer comprising an inorganic package layer;
   forming an insulation layer on a side of the inorganic package layer away from the substrate motherboard;
   removing material of the inorganic package layer located in the plurality of cutting regions by etching while simultaneously patterning the insulation layer; and
   cutting the substrate motherboard to separate the plurality of display panel regions and form a plurality of display panels.

2. The method of claim 1, further comprising:
   allowing a depth of the etching process performed in the plurality of cutting regions to reach the inorganic package layer and penetrate through the inorganic package layer;
   removing the material of the inorganic package layer located in the plurality of cutting regions by performing the etching process on the inorganic package layer.

3. The method of claim 1, further comprising:
packaging the plurality of light emitting devices to form a plurality of packaging regions separated from each other, wherein patterning the insulation layer further comprises:
removing excrescent material of the insulation layer to form a plurality of insulation regions, wherein the plurality of insulation regions correspond to the plurality of packaging regions.

4. The method of claim 3, wherein the patterning the insulation layer comprises:
removing the excrescent material by performing the etching process with a photomask having unique light transmittance, depth of the etching process performed on region outside the plurality of packaging regions being consistent, and the etching process being performed to reach and penetrate through the inorganic package layer such that material of the inorganic package layer sputtered in the plurality of cutting regions is removed.

5. The method of claim 1, further comprising:
packaging the plurality of light emitting devices to form a plurality of packaging regions separated from each other, wherein patterning the insulation layer further comprises:
removing excrescent material of the insulation layer to form a plurality of insulation regions, wherein the plurality of insulation regions correspond to the plurality of packaging regions, and edges of the plurality of packaging regions extend beyond edges of the plurality of insulation regions.

6. The method of claim 5, wherein the patterning the insulation layer comprises:
using a photomask having a plurality of regions with different light transmittance, the etching process performed on the plurality of cutting regions reaching and penetrating through the inorganic package layer, and the etching process performed on a region outside the plurality of cutting regions only penetrating through the insulation layer.

7. The method of claim 1, wherein the side of the film package layer away from the substrate motherboard is arranged with a plurality of insulation layers; and further comprising:
removing the material of the inorganic package layer located in the plurality of cutting regions by performing the etching process while patterning any insulation layer of the plurality of insulation layers.

8. The method of claim 7, wherein the side of the film package layer away from the substrate motherboard is arranged with a first insulation layer, and further comprising:
removing the material of the inorganic package layer located in the plurality of cutting regions by etching while patterning the first insulation layer.

9. The method of claim 7, wherein the side of the film package layer away from the substrate motherboard is arranged with a first insulation layer and a second insulation layer, and further comprising:
removing the material of the inorganic package layer located in the plurality of cutting regions by etching while patterning the first insulation layer.

10. The method of claim 7, wherein the side of the film package layer away from the substrate motherboard is arranged with a first insulation layer and a second insulation layer, and further comprising:
patterning the first insulation layer with only the first insulation layer being etched through; and
removing the material of the inorganic package layer located in the plurality of cutting regions by etching while patterning the second insulation layer.

11. The method of claim 10, wherein a side of the first insulation layer away from the film package layer is arranged with a touch-control film layer, the first insulation layer is a touch-control liner layer, and the second insulation layer is an insulation layer in the touch-control film layer.

12. The method of claim 11, further comprising:
forming the touch-control liner layer at the side of the film package layer away from the substrate motherboard;
forming a first touch-control metal layer at a side of the touch-control liner layer away from the substrate motherboard, the first touch-control metal layer covering an entire touch-control region;
patterning the first touch-control metal layer to form touch-control lines and a corresponding touch-control circuit pattern; and
forming the second insulation layer at a side of the first touch-control metal layer away from the substrate motherboard.

13. The method of claim 7, wherein the side of the film package layer away from the substrate motherboard is arranged with at least a first insulation layer, a second insulation layer and a third insulation layer, and further comprising:
patterning the first insulation layer with only the first insulation layer being etched through;
patterning the second insulation layer with only the second insulation layer being etched through; and
removing the material of the inorganic package layer located in the plurality of cutting regions by etching while patterning the third insulation layer.

14. The method of claim 13, wherein a side of the insulation layer away from the film package layer is arranged with a touch-control film layer, the first insulation layer is a touch-control liner layer, the second insulation layer is an insulation layer in the touch-control film layer, and the third insulation layer is a touch-control protection layer.

15. The method of claim 14, further comprising:
forming the touch-control liner layer at a side of the film package layer away from the substrate motherboard;
forming a first touch-control metal layer at a side of the touch-control liner layer away from the substrate motherboard, the first touch-control metal layer covering an entire touch-control region;
patterning the first touch-control metal layer to form touch-control lines and a corresponding touch-control circuit pattern;
forming the second insulation layer at a side of the first touch-control metal layer away from the substrate motherboard;
forming a second touch-control metal layer at a side of the second insulation layer away from the substrate motherboard, the second touch-control metal layer covering the entire touch-control region;
patterning the second touch-control metal layer to form touch-control lines and a corresponding touch-control circuit pattern; and
forming the touch-control protection layer at a side of the second touch-control metal layer away from the substrate motherboard.

16. The method of claim 1, wherein the packaging the plurality of light emitting devices comprises:
providing a mask, wherein the mask has a plurality of openings, the plurality of display panel regions comprise a plurality of display regions, and the plurality of openings correspond to the plurality of display regions in one-to-one correspondence;

depositing inorganic packaging material through the mask to form a first inorganic package layer;

forming an organic package layer on the first inorganic package layer; and forming a second inorganic package layer on the organic package layer.

17. The method of claim 16, wherein the patterning the insulation layer comprises:

while removing excrescent material of the insulation layer by etching, controlling a depth of the etching process performed in the plurality of cutting regions to reach the first inorganic package layer and to penetrate through the first inorganic package layer and the second inorganic package layer to remove material of the first inorganic package layer and the second inorganic package layer located in the plurality of cutting regions by etching.

* * * * *